(12) United States Patent
Chang et al.

(10) Patent No.: US 7,023,263 B2
(45) Date of Patent: Apr. 4, 2006

(54) LOW PASS FILTER

(75) Inventors: Chia-Jun Chang, Taipei (TW); Chao-Cheng Lee, Hsin-Chu (TW)

(73) Assignee: Realtek Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/709,101

(22) Filed: Apr. 14, 2004

(65) Prior Publication Data

US 2005/0068095 A1 Mar. 31, 2005

Related U.S. Application Data

(63) Continuation-in-part of application No. 10/707,803, filed on Jan. 13, 2004, and a continuation-in-part of application No. 10/605,327, filed on Sep. 23, 2003, now abandoned.

(30) Foreign Application Priority Data

Sep. 8, 2003 (TW) .............................. 92124750 A

(51) Int. Cl.
    *H04B 1/10* (2006.01)
(52) U.S. Cl. ..................................... 327/558; 327/563
(58) Field of Classification Search ................ 327/335, 327/337, 344, 558, 552, 553, 554, 561, 562, 327/563; 330/254, 303, 252
See application file for complete search history.

(56) References Cited

U.S. PATENT DOCUMENTS

| | | | |
|---|---|---|---|
| 5,493,246 A | 2/1996 | Anderson | 327/382 |
| 6,369,645 B1 * | 4/2002 | Takahashi | 327/558 |
| 6,437,720 B1 | 8/2002 | Yin et al. | 341/150 |
| 6,573,785 B1 | 6/2003 | Callucotte et al. | 330/9 |
| 6,583,662 B1 * | 6/2003 | Lim | 327/553 |
| 6,707,405 B1 | 3/2004 | Kuttner | 330/282 |
| 6,833,759 B1 | 12/2004 | Sobel | 341/141 |
| 2003/0146786 A1 | 8/2003 | Gulati et al. | 330/9 |

* cited by examiner

*Primary Examiner*—Linh My Nguyen
(74) *Attorney, Agent, or Firm*—Winston Hsu

(57) ABSTRACT

A low pass filter includes a differential amplifier including a positive input end, a negative input end, a positive output end, and a negative output end. A first resistive device is coupled between the negative input end and a first node. A second resistive device is coupled between the positive input end and the first node. A third resistive device substantially the same as the second resistive device is coupled between the negative input end and a second node. A fourth resistive device substantially the same as the first resistive device is coupled between the positive input end and the second node. A first capacitive device is coupled between the negative input end and the positive output end. Finally, a second capacitive device substantially the same as the first capacitive device is coupled between the positive input end and the negative output end.

15 Claims, 7 Drawing Sheets

LOW PASS FILTER

CROSS REFERENCE TO RELATED APPLICATIONS

This application claims the benefit of the filing date of Taiwan Application Ser. No. 092124750, filed Sep. 08, 2003, which is incorporated herein by reference. This application is a continuation-in-part of U.S. application Ser. No. 10/707,803, filed Jan. 13, 2004, and U.S. application Ser. No. 10/605,327, filed Sep. 23, 2003, now abandoned both of which are incorporated herein by reference.

BACKGROUND OF INVENTION

1. Field of the Invention

The present invention relates to a low pass filter, and more specifically, to a low pass filter with a large time constant.

2. Description of the Prior Art

The low pass filter is a common device in various types of circuits including a conventional servo loop 10 shown in FIG. 1. Generally speaking, the conventional servo loop 10 is used for providing a high pass filtering characteristic between an input signal Vi and an output signal Vo. To act as a high pass filter, the servo loop 10 is composed of a gain device 12 and a low pass filter 14 connected in a negative feedback configuration. As shown in FIG. 1, k/s represents a transfer function of the low pass filter 14, which includes a pole when s=0, while k is a constant corresponding to a time constant of the low pass filter 14.

Please refer to FIG. 2 showing a circuit diagram of the low pass filter 14. Node A is connected to the output voltage Vo in FIG. 1, and node B is fed back to the input voltage Vi in FIG. 1. The low pass filter 14 is composed of an operational amplifier 16, a capacitor 18 (with capacitance $C_1$), and a resistor 20 (with resistance $R_1$) connected in an integrator configuration. In this configuration, the transfer function of the low pass filter 14 is as follows:

$$\frac{k}{s} = -\frac{1}{sC_1 R_1} \qquad \text{formula 1}$$

wherein $C_1 R_1$ is the time constant of the low pass filter 14. Thus it can be seen by formula 1 that the constant k is inversely proportional to the time constant $C_1 R_1$. That is, the larger the time constant is, the smaller k is. Therefore, for better high pass filtering characteristic of the servo loop 10, a larger time constant of the low pass filter 14 is preferable.

For a larger time constant, both the capacitor 18 and the resistor 20 of the low pass filter 14 need large values. However in an integrated circuit, a capacitor and a resistor having large values occupy too much area, so that the cost of the design increases accordingly.

SUMMARY OF INVENTION

It is therefore one of the many objectives of the present invention to provide a low pass filter with a large time constant.

According to embodiments of the present invention, a low pass filter is disclosed. The low pass filter includes a differential amplifier including a positive input end, a negative input end, a positive output end and a negative output end, a first resistive device coupled between the negative input end and a first node, a second resistive device coupled between the positive input end and the first node, a third resistive device substantially the same as the second resistive device coupled between the negative input end and a second node, a fourth resistive device substantially the same as the first resistive device coupled between the positive input end and the second node, a first capacitive device coupled between the negative input end and the positive output end, and a second capacitive device substantially the same as the first capacitive device coupled between the positive input end and the negative output end.

These and other objectives of the present invention will no doubt become obvious to those of ordinary skill in the art after reading the following detailed description of the embodiments that is illustrated in the various figures and drawings.

DETAILED DESCRIPTION

Figure 1:
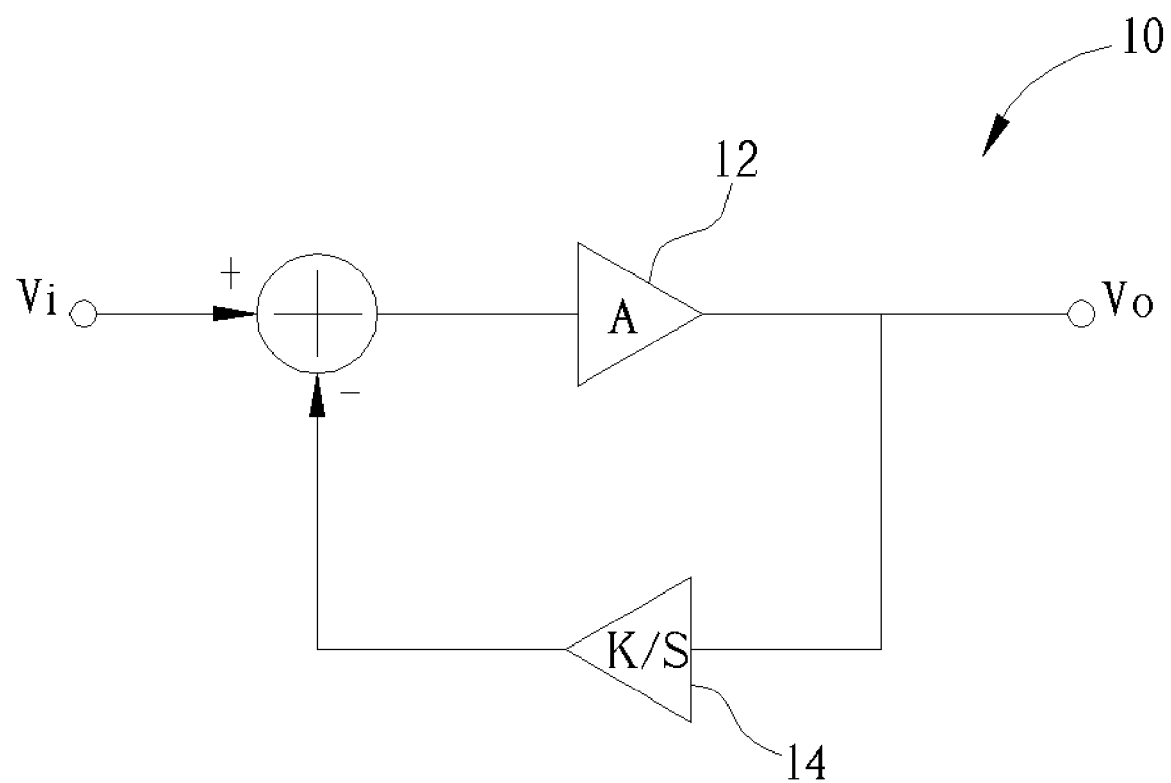
FIG. 1 illustrates a conventional servo loop.
Figure 2:
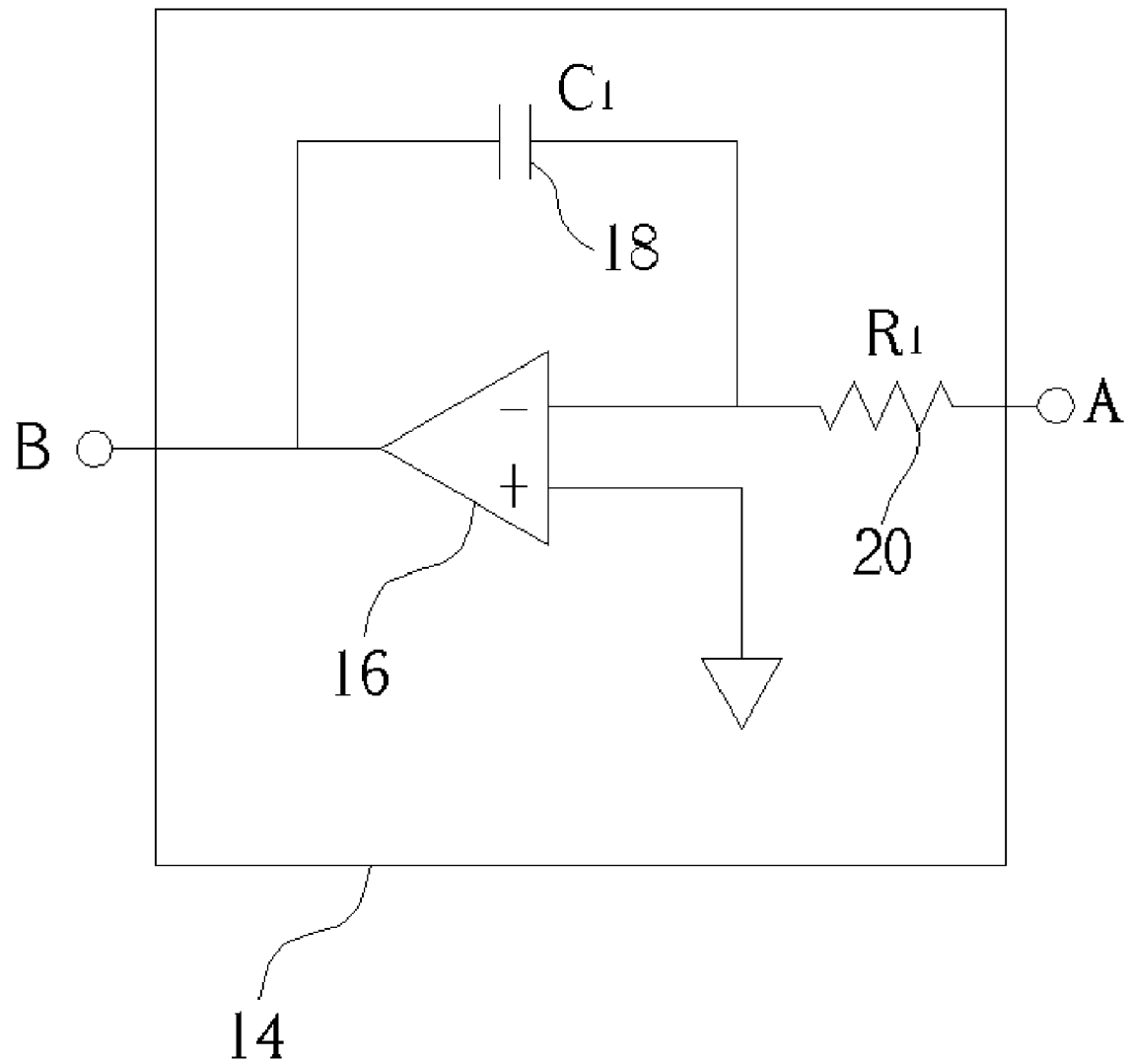
FIG. 2 is a circuit diagram of a conventional low pass filter.
Figure 3:
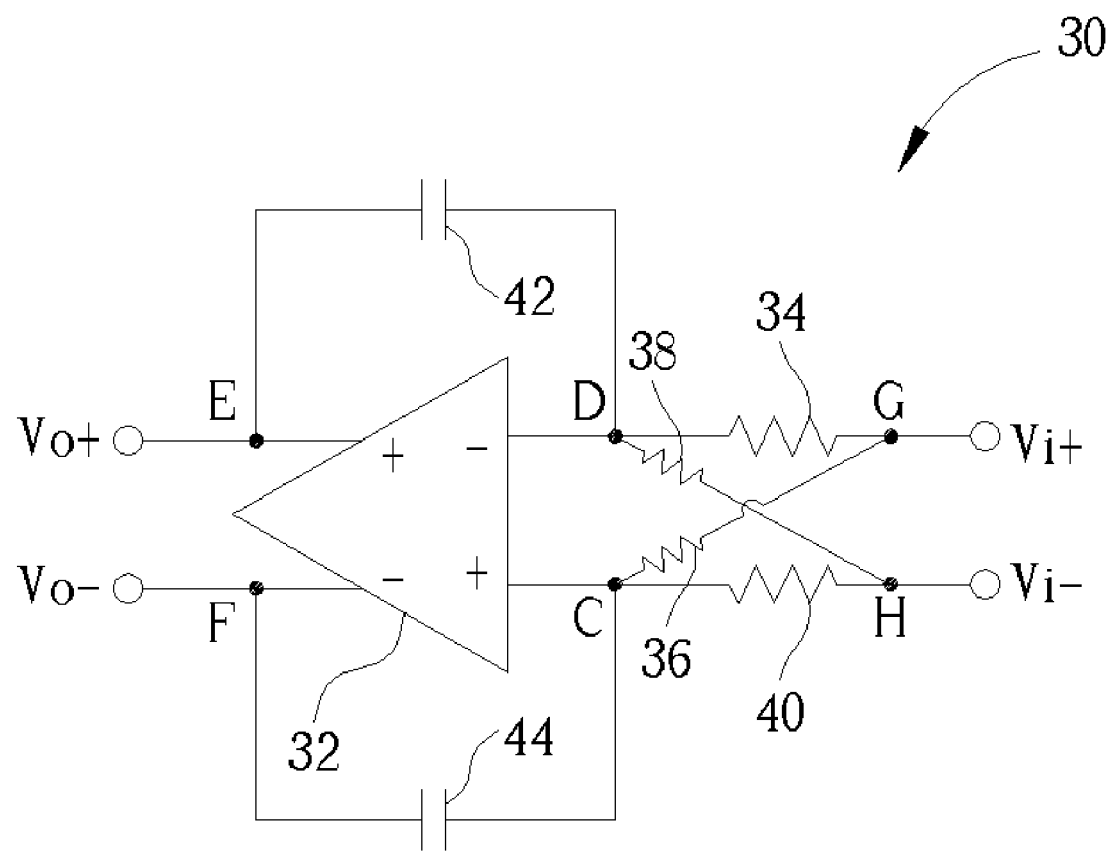
FIG. 3 illustrates a low pass filter according to an embodiment of the present invention.

Please refer to FIG. 3 showing a low pass filter according to an embodiment of the present invention. In this embodiment, the low pass filter 30 is connected in a differential configuration, for low pass filtering a first input signal $Vi^+$ and a second input signal $Vi^-$, in order to generate a first output signal $Vo^+$ and a second output signal $Vo^-$.

The low pass filter 30 in FIG. 3 includes a differential amplifier 32 having a positive input end C, a negative input end D, a positive output end E, and a negative output end F. A first resistive device 34 is coupled between the negative input end D and a first node G, a second resistive device 36 is coupled between the positive input end C and the first node G. A third resistive device 38 being substantially the same as the second resistive device 36 is coupled between the negative input end D and a second node H, and a fourth resistive device 40 being substantially the same as the first resistive device 34 is coupled between the positive input end C and the second node H. A first capacitive device 42 is coupled between the negative input end D and the positive output end E, and a second capacitive device 44 being substantially the same as the first capacitive device 42 is coupled between the positive input end C and the negative output end F. The first node G receives the first input signal $Vi^+$, and the second node H receives the second input signal $Vi^-$. The positive output end E is for outputting the first output signal $Vo^+$, and the negative output end F is for outputting the second output signal $Vo^-$.

In order to make the low pass filter 30 have a large time constant, the resistance of the first resistive device 34 and the fourth resistive device 40 is set to be $R_1$, and the resistance of the second resistive device 36 and the third resistive device 38 is set to be $R_1(1+\alpha)$, wherein $|\alpha|<<1$. That is, the value of the first resistive device 34 is very close to the value of the second resistive device 36, and the value of the third resistive device 38 is very close to the value of the fourth resistive device 40. In this case, the relative equation of current at the negative input end of the differential amplifier 32 is shown as follows:

$$\frac{Vo}{Vi} = \frac{\alpha}{sC_1R_1(1+\alpha)} \cong \frac{\alpha}{sC_1R_1} \qquad \text{formula 2}$$

From formula 2, the time constant of the low pass filter 30 is equivalent to ($C_1R_1/\alpha$), and since the absolute value of $\alpha$ is far less than 1, in the configuration of the low pass filter 30, even if the resistance $R_1$ is not a large value, the time constant can be a very large value. In such a manner, the low pass filter 30 according to this embodiment of the present invention does not require a resistive device occupying a large area for a large time constant. Please notice that, the relative equation of current at the positive input end of the differential amplifier 32 is the same to the relative equation of current at the negative input end of the differential amplifier 32 mentioned above, thus a further description is hereby omitted.

In order to manufacture two resistive devices with very close values, such as $R_1$ and $R_1(1+\alpha)$ having an $\alpha$ value complying with the requirement, the present invention discloses two embodiments of an adjustable impedance circuit to implement the impedance of $R_1$ and $R_1(1+\alpha)$.

Figure 4:
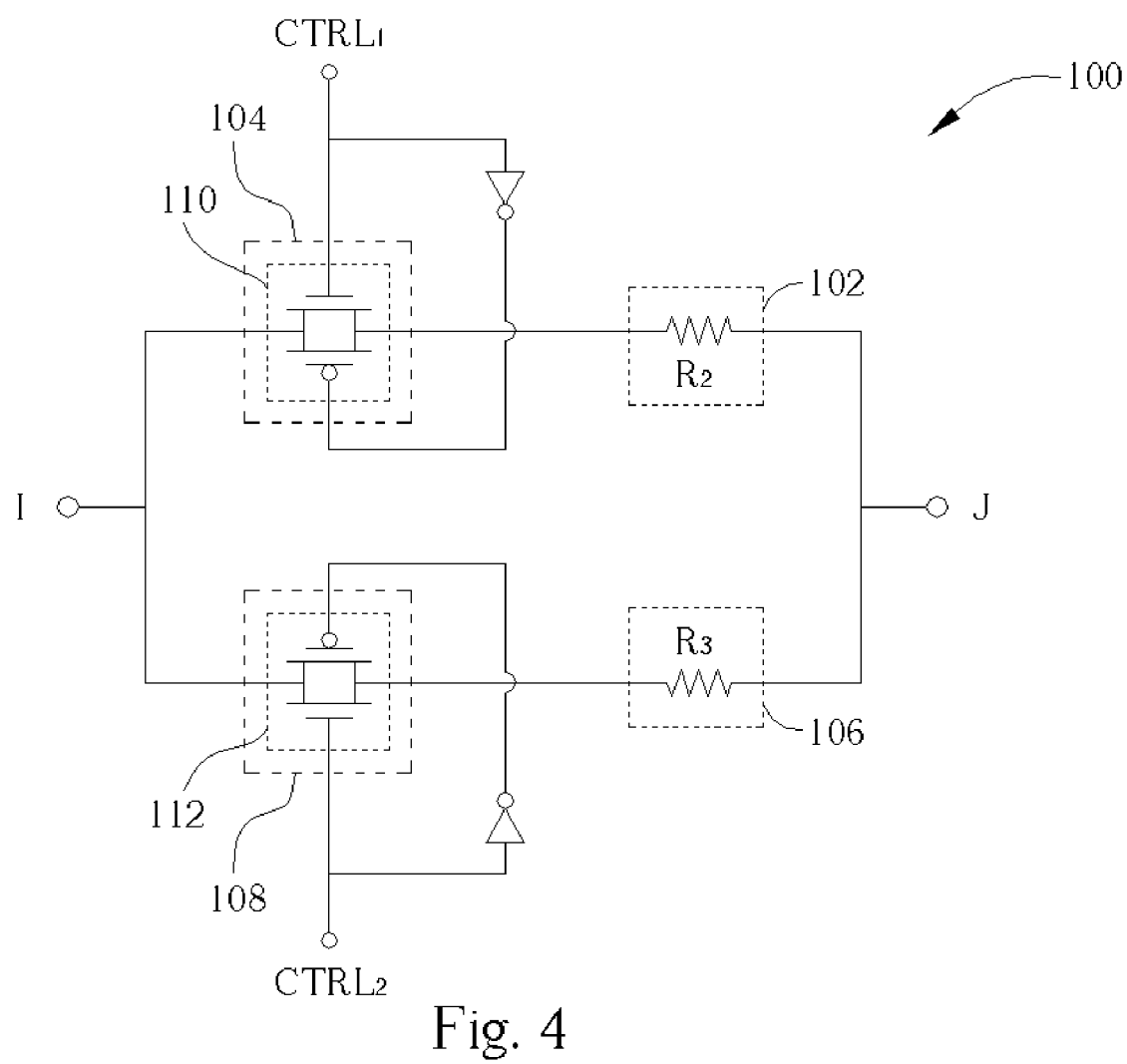
FIG. 4 illustrates an adjustable impedance circuit according to an embodiment of the present invention.

Please refer to FIG. 4 showing an adjustable impedance circuit 100 according to an embodiment of the present invention. In this embodiment, a first impedance 102 is a resistor with resistance $R_2$, a second impedance 106 is a resistor with resistance $R_3$, a first switch device 104 includes a first switch 110 for switching on and off according to a first control signal $CTRL_1$, and a second switch device 108 includes a third switch 112 for switching on and off according to a second control signal $CTRL_2$. In this embodiment, the first switch 110 and the third switch 112 are transmission gates composed of an NMOS transistor and a PMOS transistor. The gates of the NMOS transistor and the PMOS transistor control the switching of the transmission gate according to a control signal and an inverted control signal respectively.

Figure 5:
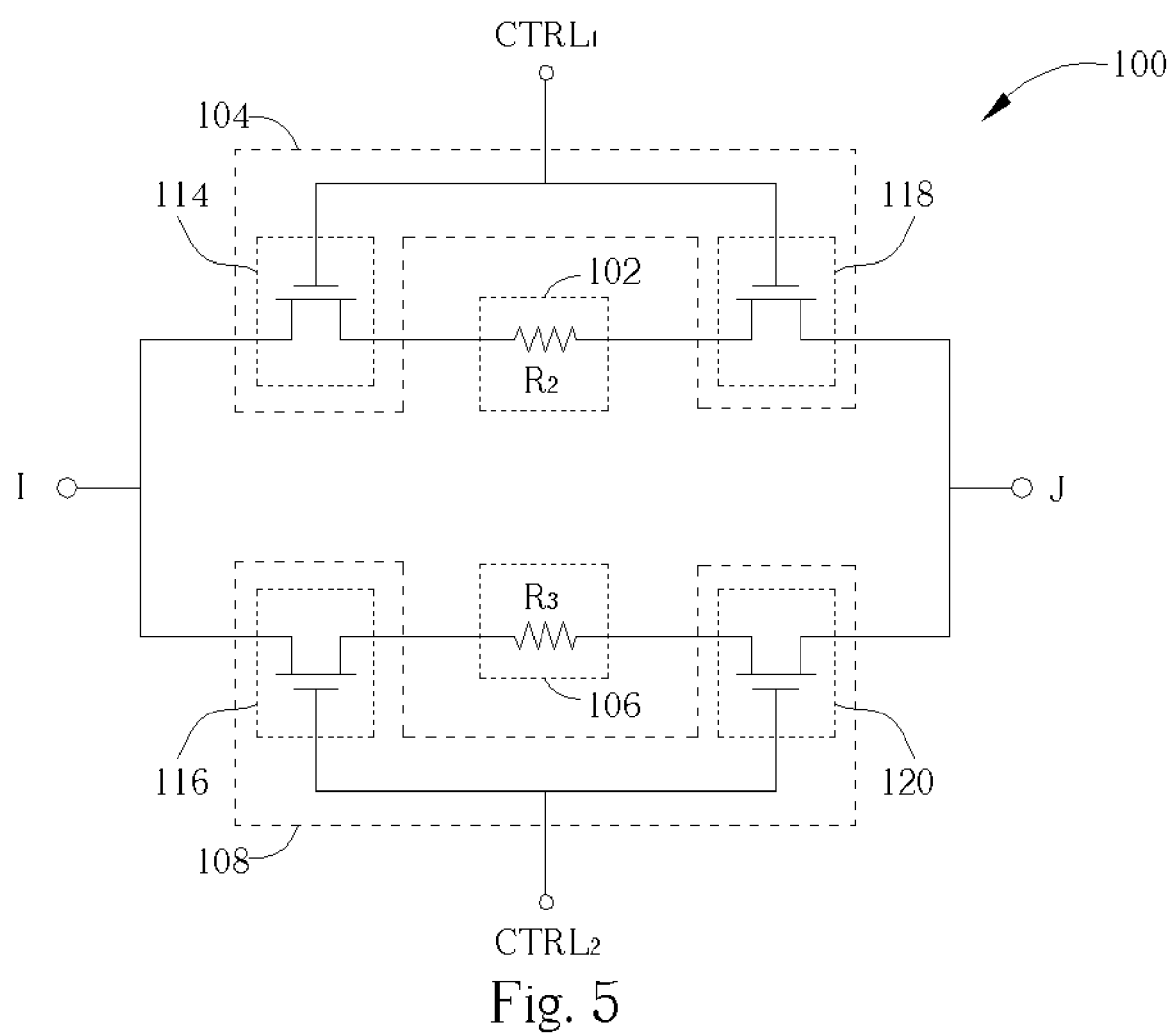
FIG. 5 illustrates an adjustable impedance circuit according to an embodiment of the present invention.

Please refer to FIG. 5 showing an adjustable impedance circuit 100 according to another embodiment of the present invention. In this embodiment, a first switch device 104 includes a first switch 114 and a second switch 118 electrically connected in series with a first impedance 102 at either end, for switching on and off according to a first control signal $CTRL_1$. Similarly, a second switch device 48 includes a third switch 116 and a fourth switch 120 electrically connected in series with a second impedance 106 at either end, for switching on and off according to a second control signal $CTRL_2$.

In this embodiment, the first switch 114 and the second switch 118 are MOS transistors switching on and off according to the first control signal $CTRL_1$, and the third switch 116 and the fourth switch 120 are also MOS transistors switching on and off according to the second control signal $CTRL_2$.

Figure 6:
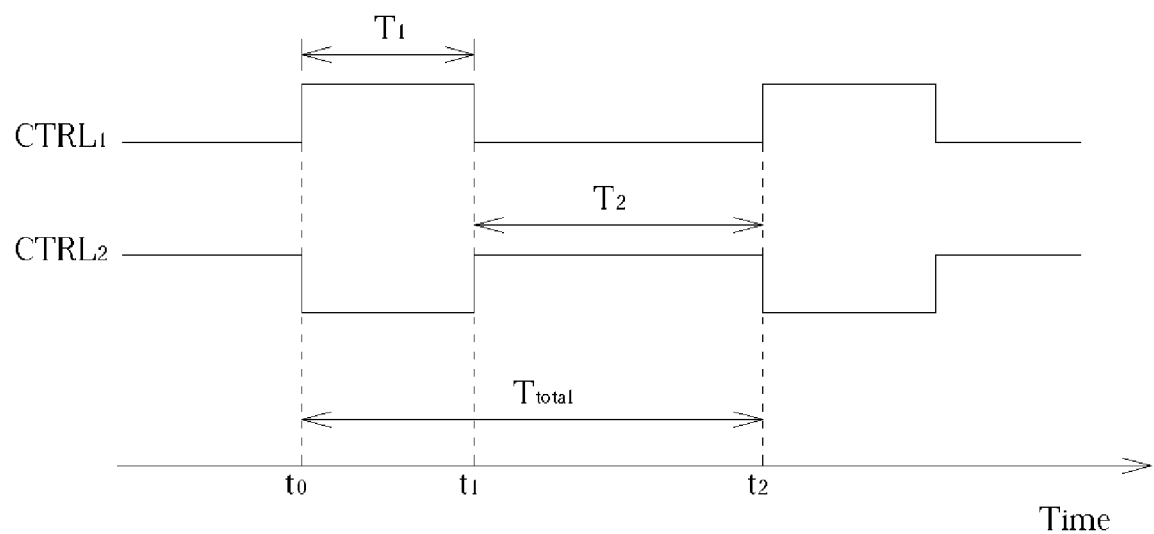
FIG. 6 is a timing diagram of the first control signal and the second control signal.

Please refer to FIG. 6 showing a timing diagram of an example of the first control signal $CTRL_1$ and the second control signal $CTRL_2$. In FIG. 6, both the first control signal $CTRL_1$ and the second control signal $CTRL_2$ are periodic signals having a period of Ttotal. The time duration of the first control signal $CTRL_1$ at a high level (i.e., the time duration of the second control signal $CTRL_2$ at a low level) is $T_1$, and the time duration of the second control signal $CTRL_2$ at a high level (i.e., the time duration of the first control signal $CTRL_1$ at a low level) is $T_2$. In this embodiment, the first control signal $CTRL_1$ and the second control signal $CTRL_2$ are complementary to each other, but the present invention is not limited thereto.

As shown in FIG. 6, when the first control signal $CTRL_1$ is at a high level and the second control signal $CTRL_2$ is at a low level, the first switch device 104 is turned on so that the first impedance 102 is electrically connected between the third node I and the fourth node J. In the mean time, the second switch device 108 is turned off so that the second impedance 106 is disconnected from the third node I and the fourth node J. Therefore between time $t_0$ and time $t_1$, the impedance of the adjustable impedance circuit 100 between the third node J and the fourth node J is equivalent to impedance $R_2$. On the contrary, when the first control signal $CTRL_1$ is at a low level and the second control signal $CTRL_2$ is at a high level, the first switch device 104 is turned off so that the first impedance 102 is disconnected from the third node I and the fourth node J. In the mean time, the second switch device 108 is turned on so that the second impedance 106 is electrically connected between the third node I and the fourth node J. Therefore between time $t_1$ and time $t_2$, the impedance of the adjustable impedance circuit 100 between the third node I and the fourth node J is equivalent to impedance $R_3$.

According to aforementioned, by periodically switching the first control signal $CTRL_1$ and the second control signal $CTRL_2$, the equivalent impedance Zeq between the third node I and the fourth node J can be shown as follows:

$$Zeq = \frac{T_1R_2 + T_2R_3}{T_{total}} = DC_1R_2 + DC_2R_3 \qquad \text{formula 3}$$

wherein $DC_1$ is the duty cycle of $CTRL_1$, and $DC_2$ is the duty cycle of $CTRL_2$. Since the behavior of a digital signal (e.g. the duty cycle of the first and the second control signal) can be accurately controlled under present technology, by controlling the adjustable impedance circuit 100 with the first control signal $CTRL_1$ and the second control signal $CTRL_2$, two impedances with very close values can be obtained.

Figure 7:
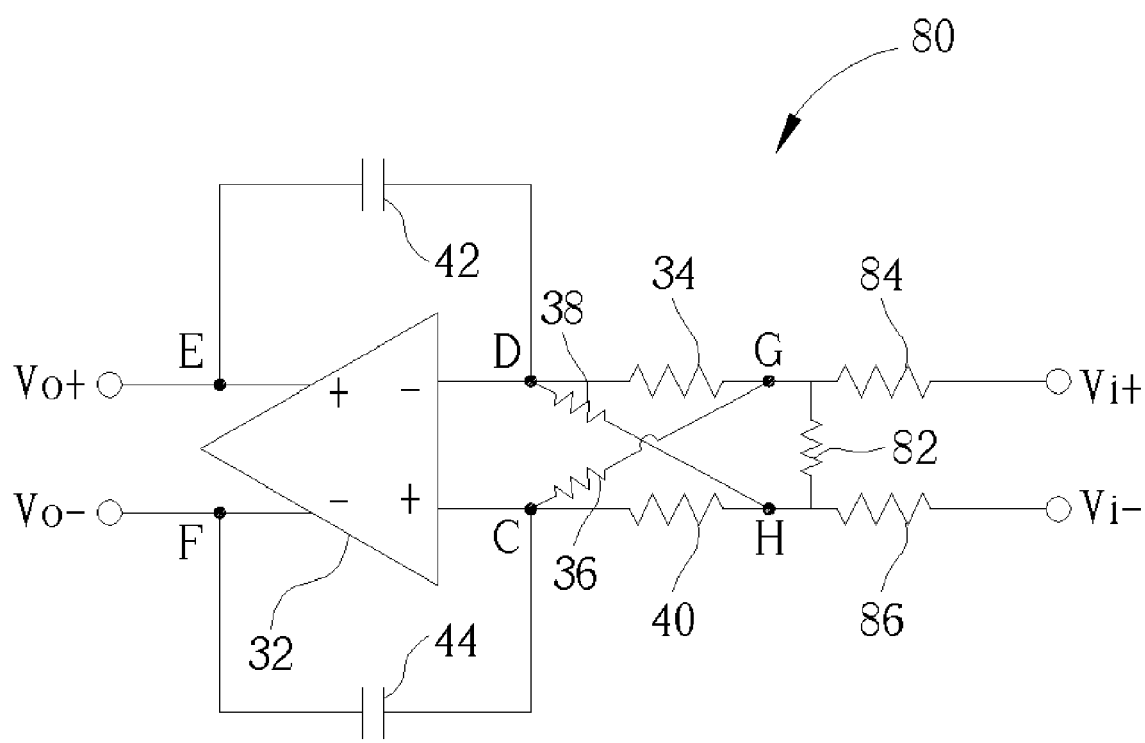
FIG. 7 illustrates a low pass filter according to another embodiment of the present invention.

Please refer to FIG. 7 showing a low pass filter according to another embodiment of the present invention. In addition to the low pass filter 30 in FIG. 3, the low pass filter 80 in FIG. 7 has at its input end a fifth resistive device 84 coupled between a first node G and a first input signal $Vi^+$. A sixth resistive device 86 substantially the same as the fifth resistive device 84 is coupled between a second node H and a second input signal $Vi^-$, and a seventh resistive device 82 is coupled between the first node G and the second node H. Assuming that the resistance of the seventh resistive device 82 is $2R_2$, and the resistances of the fifth resistive device 84 and the sixth resistive device 86 are $R_3$, in the configuration shown in FIG. 9, the equation of the low pass filter 80 is shown as follows:

$$\frac{Vo}{Vi} \cong \frac{\alpha}{sC_1R_1} \times \frac{R_2}{R_2+R_3} \qquad \text{formula 4}$$

As shown in formula 4, the time constant of the low pass filter 80 is equivalent to $$(C_1 R_1 / \alpha) \times \left(\frac{R_2 + R_3}{R_2}\right),$$

and since the absolute value of α is far less than 1, and $$\left(\frac{R_2 + R_3}{R_2}\right)$$

is larger than 1, in the configuration of the low pass filter 80, even if the resistance $R_1$ is not a large value, the time constant can still be a very large value. As described above, the low pass filter 80 not only obtains a large time constant using the first resistive device 34, the second resistive device 36, the third resistive device 38, and the fourth resistive device 40, but also increases the time constant using the fifth resistive device 84, the sixth resistive device 86, and the seventh resistive device 82.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A low pass filter comprising:
   a differential amplifier comprising a positive input end, a negative input end, a positive output end and a negative output end;
   a first resistive device directly connected between the negative input end and a first node;
   a second resistive device directly connected between the positive input end and the first node;
   a third resistive device substantially the same as the second resistive device directly connected between the negative input end and a second node;
   a fourth resistive device substantially the same as the first resistive device directly connected between the positive input end and the second node;
   a first capacitive device directly connected between the negative input end and the positive output end; and
   a second capacitive device substantially the same as the first capacitive device directly connected between the positive input end and the negative output end.

2. The low pass filter of claim 1, further comprising:
   a fifth resistive device coupled with the first node;
   a sixth resistive device substantially the same as the fifth resistive device coupled with the second node; and
   a seventh resistive device coupled between the first node and the second node.

3. The low pass filter of claim 1, wherein the first resistive device, the second resistive device, the third resistive device, and the fourth resistive device are adjustable impedance circuits respectively comprising:
   a first impedance having a first impedance value;
   a first switch device coupled to the first impedance;
   a second impedance having a second impedance value; and
   a second switch device coupled to the second impedance, wherein by controlling the switching time of the first switch device and the second switch device, the equivalent impedance of the adjustable impedance circuit can be determined by the first impedance value and the second impedance value.

4. The low pass filter of claim 3, wherein both the first impedance and the second impedance are resistors.

5. The low pass filter of claim 3, wherein both the first switch device and the second switch device comprise MOS transistors.

6. The low pass filter of claim 3, wherein the first switch device comprises a first switch electrically connected between the first impedance and a third node, and a second switch electrically connected between the first impedance and a fourth node, and the second switch device comprises a third switch electrically connected between the second impedance and the third node, and a fourth switch electrically connected between the second impedance and the fourth node.

7. The low pass filter of claim 4, wherein the first switch device and the second switch device are controlled by complementary control signals.

8. The low pass filter of claim 7 wherein the equivalent impedance is (T1*R1+T2*R2)/(T1+T2), and T1 is the turn-on time of the first switch device, T2 is the turn-on time of the second switch device, R1 is the first impedance value, and R2 is the second impedance value.

9. A low pass filter comprising:
   a differential amplifier comprising a positive input end, a negative input end, a positive output end and a negative output end;
   a first resistive device coupled between the negative input end and a first node;
   a second resistive device coupled between the positive input end and the first node;
   a third resistive device substantially the same as the second resistive device coupled between the negative input end and a second node;
   a fourth resistive device substantially the same as the first resistive device coupled between the positive input end and the second node;
   a first capacitive device coupled between the negative input end and the positive output end;
   a second capacitive device substantially the same as the first capacitive device coupled between the positive input end and the negative output end.
wherein the first resistive device, the second resistive device, the third resistive device, and the fourth resistive device are adjustable impedance circuits respectively comprising:
   a first impedance having a first impedance value;
   a first switch device coupled to the first impedance;
   a second impedance having a second impedance value; and
   a second switch device coupled to the second impedance, wherein by controlling the switching time of the first switch device and the second switch device, the equivalent impedance of the adjustable impedance circuit can be determined by the first impedance value and the second impedance value.

10. The low pass filter of claim 9, wherein both the first impedance and the second impedance are resistors.

11. The low pass filter of claim 9, wherein both the first switch device and the second switch device comprise MOS transistors.

12. The low pass filter of claim 9, wherein the first switch device comprises a first switch electrically connected between the first impedance and a third node, and a second switch electrically connected between the first impedance and a fourth node, and the second switch device comprises a third switch electrically connected between the second impedance and the third node, and a fourth switch electrically connected between the second impedance and the fourth node.

13. The low pass filter of claim 10, wherein the first switch device and the second switch device are controlled by complementary control signals.

14. The low pass filter of claim 13 wherein the equivalent impedance is (T1*R1+T2*R2)/(T1+T2), and T1 is the turn-on time of the first switch device, T2 is the turn-on time of the second switch device, R1 is the first impedance value, and R2 is the second impedance value.

15. A low pass filter comprising:
a differential amplifier comprising a positive input end, a negative input end, a positive output end and a negative output end;
a first resistive device coupled between the negative input end and a first node;
a second resistive device coupled between the positive input end and the first node;
a third resistive device substantially the same as the second resistive device coupled between the negative input end and a second node;
a fourth resistive device substantially the same as the first resistive device coupled between the positive input end and the second node;
a first capacitive device coupled between the negative input end and the positive output end;
a second capacitive device substantially the same as the first capacitive device coupled between the positive input end and the negative output end;
a fifth resistive device coupled with the first node;
a sixth resistive device substantially the same as the fifth resistive device coupled with the second node; and
a seventh resistive device coupled between the first node and the second node.

* * * * *